US008304813B2

(12) United States Patent  (10) Patent No.: US 8,304,813 B2
Lassa et al.  (45) Date of Patent: Nov. 6, 2012

(54) CONNECTION BETWEEN AN I/O REGION AND THE CORE REGION OF AN INTEGRATED CIRCUIT

(75) Inventors: Paul Lassa, Cupertino, CA (US); Paul Paternoster, Los Altos, CA (US); Brian Cheung, San Bruno, CA (US)

(73) Assignee: SanDisk Technologies, Inc., Plano, TX (US)

( * ) Notice: Subject to any disclaimer, the term of this patent is extended or adjusted under 35 U.S.C. 154(b) by 693 days.

(21) Appl. No.: 11/651,614

(22) Filed: Jan. 8, 2007

(65) Prior Publication Data

US 2008/0164615 A1    Jul. 10, 2008

(51) Int. Cl.
*H01L 27/118*    (2006.01)
(52) U.S. Cl. .................. 257/203; 257/E27.11
(58) Field of Classification Search .................. 257/203, 257/E27.11
See application file for complete search history.

(56) References Cited

U.S. PATENT DOCUMENTS

| | | | |
|---|---|---|---|
| 5,365,091 A * | 11/1994 | Yamagishi | 257/203 |
| 5,641,978 A | 6/1997 | Jassowski | |
| 5,757,203 A | 5/1998 | Brown | |
| 6,071,314 A * | 6/2000 | Baxter et al. | 716/17 |
| 6,078,068 A * | 6/2000 | Tamura | 257/203 |
| 6,404,226 B1 * | 6/2002 | Schadt | 326/41 |
| 6,717,222 B2 * | 4/2004 | Zhang | 257/390 |
| 6,730,946 B2 * | 5/2004 | Saito | 257/207 |
| 6,734,563 B2 * | 5/2004 | Lin et al. | 257/773 |
| 6,751,768 B2 | 6/2004 | Muradali | |
| 6,924,661 B2 * | 8/2005 | Buffet et al. | 326/38 |
| 7,051,306 B2 | 5/2006 | Hoberman | |
| 7,080,341 B2 | 7/2006 | Eisenstadt | |
| 7,491,986 B2 * | 2/2009 | Kumagae et al. | 257/203 |
| 2001/0049813 A1 | 12/2001 | Chan | |
| 2004/0158750 A1 | 8/2004 | Syed | |
| 2005/0285281 A1 | 12/2005 | Simmons | |
| 2006/0022687 A1 * | 2/2006 | Ali et al. | 324/754 |
| 2006/0076977 A1 | 4/2006 | Zhu | |

OTHER PUBLICATIONS

U.S. Appl. No. 11/649,325, filed Dec. 31, 2006, Paternoster.
U.S. Appl. No. 11/649,326, filed Dec. 31, 2006, Paternoster.
U.S. Appl. No. 11/686,350, filed Mar. 14, 2007, Lassa.

* cited by examiner

*Primary Examiner* — Benjamin Sandvik
(74) *Attorney, Agent, or Firm* — Brinks Hofer Gilson & Lione

(57) ABSTRACT

A connection between a first circuit within an I/O region of an integrated circuit chip and a second circuit within a core region of the chip. The first circuit is connected to a bonding pad through a first conductor in a first layer of an I/O region. The second circuit is connected to the bonding pad through a second conductor in a second layer of an I/O region above the first layer.

21 Claims, 2 Drawing Sheets

CONNECTION BETWEEN AN I/O REGION AND THE CORE REGION OF AN INTEGRATED CIRCUIT

FIELD OF THE INVENTION

The invention relates to signal connections between an I/O region and the core region of an integrated circuit chip.

BACKGROUND OF THE INVENTION

The most common layout for an integrated circuit chip provides for all power and data connections to the chip at a series of metal bonding pads arrayed in a strip adjacent the entire perimeter of the chip. Although this strip typically is rectangular, it is referred to as an "I/O region", "I/O ring" or "pad ring" of the chip. In addition to the bonding pads, an I/O region typically includes a region radially inward of the bonding pads that includes power and ground buses in a plurality of metal layers and I/O (input/output) circuitry in semiconductor layers below the metal layers. The remainder of the chip that is encircled by an I/O region is referred to as the core.

Integrated circuit chips are designed by combining many subsystems, commonly called blocks or cells. To reduce design costs, different subsystems within a single chip commonly are designs licensed from different third parties. Subsystems licensed from third parties commonly are referred to as IP (intellectual property) cells.

Some types of subsystems require connections external to the chip. For example, a crystal oscillator subsystem requires two connections to the two pins of a crystal. As explained above, external connections typically are made at the perimeter of a chip. Therefore, subsystems that require external connections commonly are designed to be located in an I/O region so that they can connect directly to the bonding pads. Such subsystems commonly are designed to receive their operating power by direct connections to the bonding pads or to the power buses within an I/O region.

In some chip designs, it may be important for a subsystem in an I/O region to receive its operating power from circuitry in the core region of the chip rather than from the power buses or bonding pads in an I/O region. For example, to modulate power consumption by the subsystem, it may be desirable to include, in the core region of the chip a variable voltage regulator that either varies the voltage supplied to the subsystem or switches the voltage off and on. However, subsystems licensed from third parties that are designed to be located in an I/O region typically do not include a connection path for receiving power from the core; they are only designed to receive power from the power buses or bonding pads in an I/O region.

A similar problem may exist for signals other than power signals, such as analog signals or digital data signals. For example, a subsystem designed to be located in an I/O region may include a first signal connection point at which the subsystem inputs or outputs a first signal. The first signal connection point may be connected to a bonding pad in an I/O region so that the bonding pad is designed to be the only means for connecting the first signal connection point to circuitry outside the subsystem. If the subsystem does not include a connection path between the first signal connection point and the core, then a problem exists if it is desired to connect the first signal connection point to circuitry in the core.

Therefore, a need exists for a connection technique to couple operating power or any other signal between the core of a chip and a subsystem in an I/O region that does not include a connection path for such signal from the core.

SUMMARY OF THE INVENTION

The invention is an apparatus and method for connecting a signal between a first circuit within an I/O region of an integrated circuit chip and a second circuit within a core region of the chip. The first circuit is connected to a bonding pad through a first conductor in a first layer of an I/O region. The second circuit is connected to the bonding pad through a second conductor in a second layer of an I/O region above the first layer.

An advantage of the invention is that, by using a bonding pad to connect between conductors in the first and second layers, a connection can be made between the core and the first circuit even if the first circuit does not provide a direct connection path to the core.

The invention is especially valuable if a portion of the first circuit blocks a connection path between the core region and a signal connection point of the first circuit that is connected to the aforesaid first conductor. Such blockage can occur if the first circuit occupies a portion of the first layer of an I/O region between the first conductor and the core region so as to preclude a third conductor in the first layer of an I/O region from extending from the first conductor to the core region.

BRIEF DESCRIPTION OF THE DRAWINGS

FIGS. 1 and 2 are each details of the left edge of the chip, so that the left side of each drawing depicts the left edge of the chip, and the right side of each drawing depicts the left portion of the core of the chip.

DETAILED DESCRIPTION OF THE PREFERRED EMBODIMENTS

Figure 1:
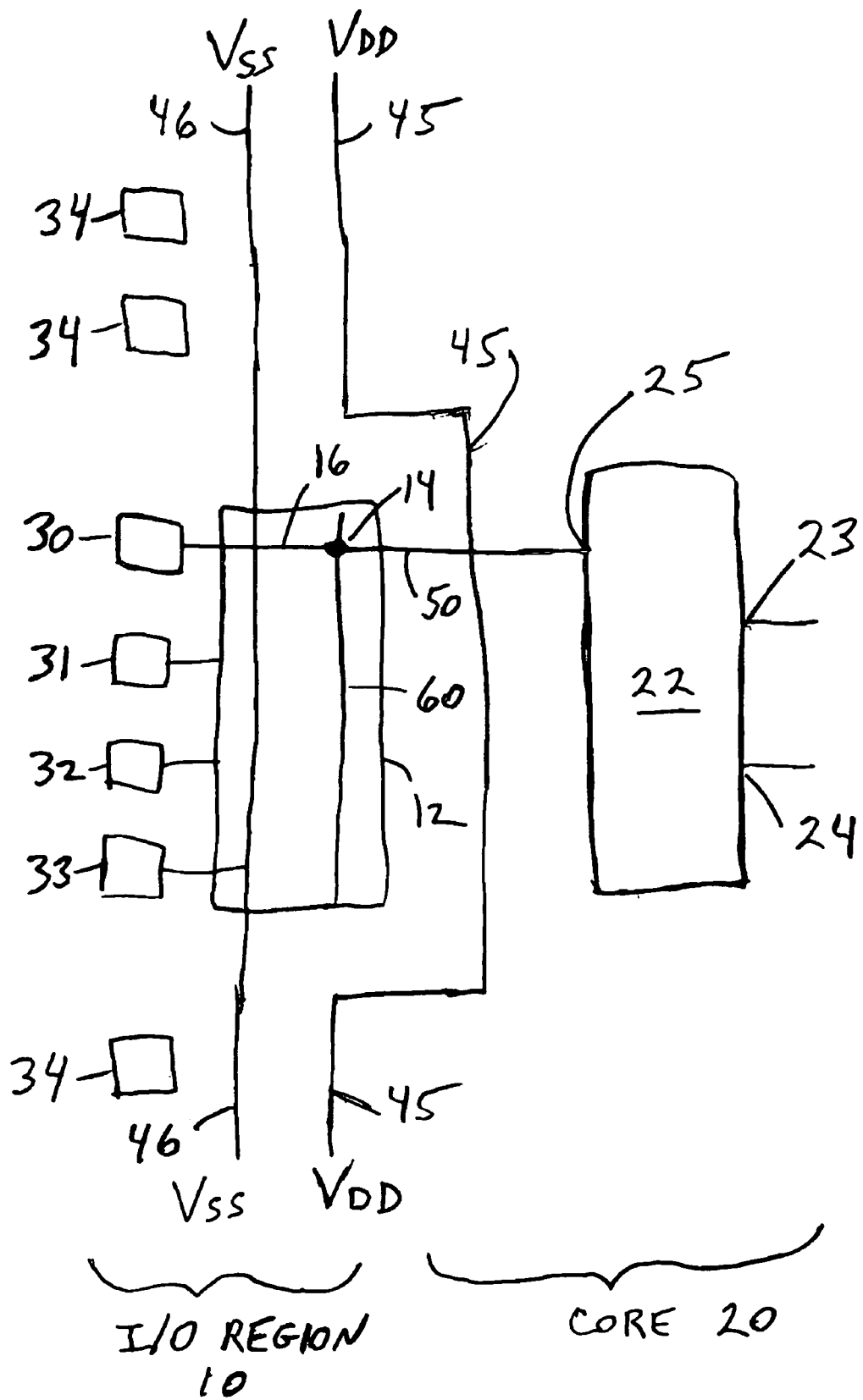
FIG. 1 is a schematic top view.
Figure 2:
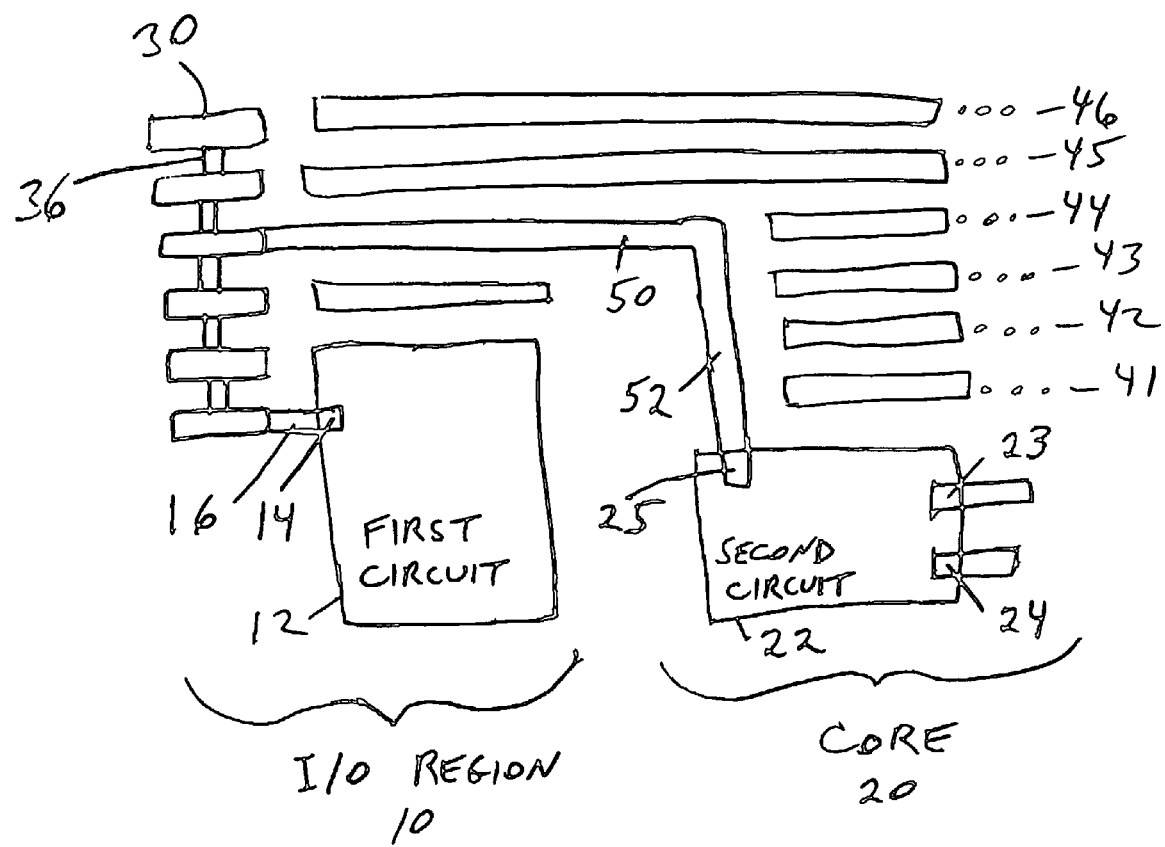
FIG. 2 is a sectional side view, of an integrated circuit chip according to the invention.

FIGS. 1 and 2 illustrate an embodiment of the invention for providing a signal connection between a first circuit 12 within an I/O region 10 of an integrated circuit chip and a second circuit 22 within the core region 20 of the chip. FIGS. 1 and 2 are each details of the left edge of the chip, so that the left side of each drawing depicts the left edge of the chip, and the core region extends rightward beyond the right side of the drawing.

Numerous bonding pads are arrayed along the edge of the chip to provide signal connections to the chip. The illustrated bonding pads include pads 30-33 connected to the first circuit 12 and pads 34 connected to other circuitry (not shown) within an I/O region 10. The core region is the central region of the chip, and an I/O region is the region of the chip adjoining the bonding pads, between the bonding pads and the core.

FIG. 2 shows that the chip has six metal layers that can be used to provide connections between circuits on the chip. Illustrative conductors in the first through sixth metal layers are labeled 41-46, respectively. Conductor 45 in the fifth layer is a power bus VDD, and conductor 46 in the sixth layer is a ground bus VSS. Each pair of adjacent metal layers is separated by a dielectric layer, represented in the figures by the white spaces between the conductors. The chip also includes numerous semiconductor, conductor and dielectric layers below the metal layers. FIG. 2 illustrates the first circuit 12 as having portions occupying the first two metal layers and the semiconductor layers below the metal layers. The second circuit 22 is illustrated as occupying only the layers below the metal layers.

In the illustrated embodiment, the first circuit 12 is a crystal oscillator whose connections to four bonding pads 30-33 are as follows. Pads 31 and 32 connect to an external crystal. Pad 33 connects to an electrical ground VSS. Pad 34 connects to a power supply voltage VDD.

In the exemplary integrated circuit chip, the oscillator circuit 12 is required only during certain operational modes of the integrated circuit. During other operational modes when the oscillator is not needed, it is beneficial to either reduce or disable the supply of power to the oscillator to reduce the power consumption of the integrated circuit.

The function of enabling and disabling the supply of power to the oscillator circuit 12 is performed by the second circuit 22, which is a power switch or voltage regulator. The second circuit 22 includes a power input 23 at which it receives an input voltage from other circuitry in the core and a control input 24 at which it receives a control signal from other circuitry in the core. The second circuit also includes a power output 25 at which it produces an output voltage whose level is controlled by the second circuit in response to the control signal. If the second circuit is a power switch, the control signal can be a binary signal that controls whether the power switch couples the input voltage to the output 25 or sets the output voltage to zero. If the second circuit is a voltage regulator, the control signal can be an analog signal or a multi-bit digital signal that controls the level of the output voltage produced by the voltage regulator.

The oscillator circuit 12 includes a power input 14 at which it must receive its operating power. The power input of the oscillator is connected to bonding pad 30 through a conductor 16 in the first metal layer. As shown in FIG. 2, the bonding pad 30 (like each of the bonding pads 31-34) includes six metal conductors at each of the six metal layers, and the six conductors of the bonding pad are connected together by metal vias 36.

The conventional means of connecting to a circuit that is connected to a bonding pad is by making a direct connection to the top of the bonding pad. However, the invention takes advantage of the fact that the bonding pad extends through each of the metal layers, so a connection between the core and the bonding pad can be made by a conductor at any of these layers.

The power input 14 of the oscillator circuit 12 is in the first metal layer. Because the illustrated oscillator circuit extends into the first two metal layers, it is impractical or impossible to provide a conductor in the first layer that extends from the oscillator power input 14 to the second circuit 22 because the oscillator circuit is blocking all paths through which such a conductor could extend.

The novel means by which the power output 25 of the second circuit is connected to the power input 14 of the first circuit is a conductor 50 that connects to the power pad 30 within a metal layer above the metal layer containing the power input 14. In the illustrated example, the conductor 50 is in the fourth metal layer. A via 52 connects the conductor to the power output 25.

FIG. 1 shows that the first circuit 12 can include its own power bus 60 for distributing the power it receives from the power output 25 of the second circuit. Because the power bus 60 of the first circuit is separate from the main power bus 45 that supplies power to adjoining portions of the I/O region 10, the main power bus 45 is shown in FIG. 1 as routed around the area occupied by the first circuit along a path through a portion of the core region adjoining the first circuit.

Although the invention has been illustrated by the example of the first circuit within an I/O region being a crystal oscillator and the second circuit within the core region being a power switch or voltage regulator, the invention is equally useful to connect any type of analog, digital, or power signal between a first circuit within an I/O region and a second circuit within the core region. Either of the two circuits can provide the signal input and the signal output, respectively. The signal input of one circuit and signal output of the other circuit can be more generally referred to as signal connection points because the invention is independent of the direction of signal flow. The invention is useful whenever it is desired to connect a signal between a first signal connection point of a first circuit within an I/O region of an integrated circuit chip and a second circuit within a core region of the chip, where the first signal connection point is connected to a bonding pad.

For the purposes of this patent description, the term "conductor" includes any connecting path formed of conductor or semiconductor material, regardless of the resistance of the connecting path or the resistivity of the material.

Various preferred embodiments and implementation features are further discussed in the following U.S. patent applications, each of which is hereby incorporated by reference in its entirety into the present patent specification:

Ser. No. 11/649,325, filed 31 Dec. 2006, entitled "Selectively Powering Data Interfaces";

Ser. No. 11/649,326, filed 31 Dec. 2006, entitled "Selectively Powered Data Interfaces";

Ser. No. 60/921,508, filed 1 Jan. 2007, entitled "Decoupling with Two Types of Capacitors";

Ser. No. 60/934,397, filed 1 Jan. 2007, entitled "Chip with Two Types of Decoupling Capacitors";

Ser. No. 60/934,923, filed 31 Dec. 2006, entitled "Internally Protecting Lines at Power Island Boundaries";

Ser. No. 60/999,760, filed 31 Dec. 2006, entitled "Integrated Circuit with Protected Internal Isolation";

Ser. No. 60/934,917, filed 31 Dec. 2006, entitled "Updating Delay Trim Values";

Ser. No. 60/934,918, filed 31 Dec. 2006, entitled "Module with Delay Trim Value Updates on Power-Up";

Ser. No. 60/921,507, filed 31 Dec. 2006, entitled "Limiting Power Island Inrush Current";

Ser. No. 60/934,936, filed 31 Dec. 2006, entitled "Systems and Integrated Circuits with Inrush-Limited Power Islands";

Ser. No. 11/618,865, filed 31 Dec. 2006, entitled "Method for Performing Full Transfer Automation in a USB Controller";

Ser. No. 11/618,867, filed 31 Dec. 2006, entitled "USB Controller with Full Transfer Automation";

Ser. No. 11/618,849, filed 31 Dec. 2006, entitled "Method for Configuring a USB Physical Layer Interface to Loopback Mode"; and Ser. No. 11/618,852, filed 31 Dec. 2006, entitled "Apparatus for Configuring a USB Physical Layer Interface to Loopback Mode".

The invention claimed is:

1. An integrated circuit chip comprising:
a core region having metal layers;
an I/O region between the core region and an edge of the chip, wherein the I/O region includes a first conductor in a first metal layer and a second conductor in a second metal layer;
a bonding pad within the I/O region, the bonding pad comprising a metal conductor at each of the metal layers, wherein the first conductor is connected to a first metal conductor of the bonding pad and the second conductor is connected to a second metal conductor of the bonding pad;

a first circuit within the I/O region, wherein the first circuit is connected to the first conductor at an input of the first circuit;

a second circuit within the core region and below all of the metal layers, wherein the second circuit is connected to the second conductor at an output of the second circuit; and wherein a portion of the first circuit occupies a portion of the first metal layer of the I/O region between the first conductor and the core region so as to preclude a third conductor in the first metal layer of the I/O region from extending from the first conductor to the core region; and wherein the first circuit is configured to receive a signal from the second circuit via the first and second conductors and the bonding pad.

2. The chip of claim 1, wherein:
a portion of the first circuit occupies a portion of the first metal layer of the I/O region between the first conductor and the core region.

3. The chip of claim 1, wherein:
the second circuit includes first and second inputs connected to receive first and second input signals, and wherein the second circuit is configured to produce the signal, that is received by the first circuit, at the output of the second circuit based on the values of the first and second inputs.

4. The chip of claim 1, wherein:
the input of the first circuit comprises includes a power input;
the second circuit comprises a power control circuit including a control input connected to receive a control signal and a power input connected to receive a first voltage, wherein the output of the second circuit comprises and a power output at which the power control circuit supplies a second voltage and wherein the power control circuit controls the level of the second voltage in response to the control signal; and
the signal received by the first circuit comprises the power output of the power control circuit.

5. The chip of claim 4, wherein:
the power control circuit is a power switch.

6. The chip of claim 4, wherein:
the power control circuit is a voltage regulator.

7. The chip of claim 1, wherein:
the second conductor extends between the I/O region and the core region.

8. The chip of claim 1, further comprising a dielectric layer between the first and second metal layers.

9. The chip of claim 1, wherein the second metal layer is above the first metal layer.

10. An integrated circuit chip comprising:
a core region having metal layers;
an I/O region between the core region and an edge of the chip, wherein the I/O region includes a first conductor and a second conductor vertically separated from the first conductor;
a bonding pad within the I/O region, wherein the bonding pad is electrically connected to the first and second conductors;
a first circuit within the I/O region, wherein the first circuit is connected to the said first conductor;
a second circuit within the core region and below all of the metal layers, wherein the second circuit is connected to the second conductor; and wherein a portion of the first circuit occupies a portion of a the first metal layer of the I/O region between the first conductor and the core region so as to preclude a third conductor in the first metal layer of the I/O region from extending from the first conductor to the core region; and wherein the first circuit is configured to receive a signal from the second circuit via the first and second conductors and the bonding pad.

11. The chip of claim 10, wherein:
a portion of the first circuit occupies a portion of the first metal layer of the I/O region between the first conductor and the core region.

12. The chip of claim 10, wherein:
the first circuit includes an input connected to said first conductor in the first metal layer of the I/O region; and
the second circuit includes an output connected to the second conductor in the second metal layer of the I/O region.

13. The chip of claim 10, wherein:
the first circuit includes an input connected to said first conductor in the first metal layer of the I/O region;
the second circuit includes first and second inputs connected to receive first and second input signals and an output at which the second circuit produces an output signal, wherein the second circuit changes the value of the output signal in response to the respective values of the first and second input signals; and
the output of the second circuit is connected to the second conductor in the second metal layer of the I/O region.

14. The chip of claim 10, wherein:
the first circuit includes a power input connected to said first conductor in the first metal layer of the I/O region;
the second circuit comprises a power control circuit including a control input connected to receive a control signal, a power input connected to receive a first voltage, and a power output at which the power control circuit supplies a second voltage, wherein the power control circuit controls the level of the second voltage in response to the control signal; and
the power output of the power control circuit is connected to the second conductor in the second metal layer of the I/O region.

15. The chip of claim 14, wherein:
the power control circuit is a power switch.

16. The chip of claim 14, wherein:
the power control circuit is a voltage regulator.

17. The chip of claim 10, wherein:
the first circuit includes an output connected to said first conductor in the first metal layer of the I/O region; and
the second circuit includes an input connected to the second conductor in the second metal layer of the I/O region.

18. The chip of claim 10, wherein:
the second conductor extends between the I/O region and the core region.

19. The chip of claim 10, further comprising a dielectric layer between the first and second layers.

20. The chip of claim 10, wherein the second conductor is above the first conductor.

21. An integrated circuit chip comprising:
a core region having metal layers;
an I/O region between the core region and an edge of the chip, wherein the I/O region includes a first conductor in a first metal layer and a second conductor in a second metal layer;
a bonding pad within the I/O region, the bonding pad comprising a metal conductor at each of the metal layers, wherein the first conductor is connected to a first metal conductor of the bonding pad and the second conductor is connected to a second metal conductor of the bonding pad;

a crystal oscillator within the I/O region, wherein the crystal oscillator is connected to the first conductor at a power input of the crystal oscillator;

a voltage regulator within the core region, wherein the voltage regulator is connected to the second conductor at a power output of the voltage regulator; and wherein a portion of the crystal oscillator occupies a portion of the first metal layer of the I/O region between the first conductor and the core region so as to preclude a third conductor in the first metal layer of the I/O region from extending from the first conductor to the core region; and wherein the crystal oscillator is configured to receive a signal from the voltage regulator via the first and second conductors and the bonding pad.

* * * * *

UNITED STATES PATENT AND TRADEMARK OFFICE
CERTIFICATE OF CORRECTION

PATENT NO. : 8,304,813 B2
APPLICATION NO. : 11/651614
DATED : November 6, 2012
INVENTOR(S) : Paul Lassa et al.

Page 1 of 1

It is certified that error appears in the above-identified patent and that said Letters Patent is hereby corrected as shown below:

<u>In the Claims</u>

In column 5, claim 4, line 31, after "first circuit comprises" delete "includes".

In column 5, claim 4, line 36, after "second circuit comprises" delete "and".

In column 6, claim 10, line 2, before "first metal layer of the" delete "the".

Signed and Sealed this
Seventh Day of May, 2013

Teresa Stanek Rea
*Acting Director of the United States Patent and Trademark Office*